(12) United States Patent
Ohnishi et al.

(10) Patent No.: US 7,248,118 B2
(45) Date of Patent: Jul. 24, 2007

(54) RADIO FREQUENCY POWER AMPLIFIER MODULE

(75) Inventors: Masami Ohnishi, Hachioji (JP); Tomonori Tanoue, Machida (JP); Hidetoshi Matsumoto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/830,049

(22) Filed: Apr. 23, 2004

(65) Prior Publication Data

US 2004/0212438 A1    Oct. 28, 2004

(30) Foreign Application Priority Data

Apr. 23, 2003 (JP) ............... 2003-118030

(51) Int. Cl.
*H03G 3/10* (2006.01)
(52) U.S. Cl. ............ 330/285; 330/284; 330/286; 330/296
(58) Field of Classification Search .......... 330/285, 330/129, 279, 136, 134, 297, 127, 140, 286, 330/295, 277, 59, 176, 301–311
See application file for complete search history.

(56) References Cited

U.S. PATENT DOCUMENTS

| 5,973,567 A * | 10/1999 | Heal et al. ............... 330/286 |
| 6,091,292 A * | 7/2000 | Higashiyama et al. ........ 330/10 |
| 6,456,125 B1 * | 9/2002 | Miyazawa .................. 327/113 |
| 6,714,071 B1 * | 3/2004 | Page ......................... 330/136 |
| 6,759,906 B2 * | 7/2004 | Matsunaga et al. ......... 330/285 |
| 6,774,718 B2 * | 8/2004 | Ichitsubo et al. ........... 330/129 |
| 6,775,525 B1 * | 8/2004 | Tanoue et al. ........... 455/127.3 |
| 6,885,246 B2 * | 4/2005 | Tsutsui et al. ............. 330/285 |
| 6,914,480 B2 * | 7/2005 | Arai et al. .................. 330/126 |
| 7,050,769 B2 * | 5/2006 | Imai et al. ............... 455/114.3 |
| 7,091,857 B2 * | 8/2006 | Lanigan et al. .......... 340/545.6 |
| 7,116,175 B2 * | 10/2006 | Shimizu et al. ............ 330/307 |
| 2005/0134389 A1 * | 6/2005 | Scherrer et al. ............ 330/310 |

FOREIGN PATENT DOCUMENTS

JP          06-224660        8/1994

* cited by examiner

*Primary Examiner*—Linh V. Nguyen
(74) *Attorney, Agent, or Firm*—Antonelli, Terry, Stout & Kraus, LLP.

(57) ABSTRACT

A radio frequency power amplifier module that brings sufficient attenuation to a radio frequency signal in a bias supply line connecting a bias control part and a radio frequency power amplifier part without increasing module substrate area is aimed. At least one bonding pad 106 having a capacitance component to a ground and stitch structure inductances 108, 109 composed of a bonding wire 105 provided via the bonding pad are provided in the bias supply line connecting the bias control part and the radio frequency power amplifier part.

11 Claims, 8 Drawing Sheets

TOP OF VIEW

SIDE OF VIEW

RADIO FREQUENCY POWER AMPLIFIER MODULE

CLAIM OF PRIORITY

The present patent application claims priority from Japanese application JP 2003-118030 filed on Apr. 23, 2003, the content of which is hereby incorporated by reference into this application.

FIELD OF THE INVENTION

The present invention relates to a radio frequency power amplifier used in the transmitting part of a radio communications apparatus, such as a cellular phone, and, more particularly to a radio frequency power amplifier module having a bias control circuit.

BACKGROUND OF THE INVENTION

A radio frequency power amplifier used in a radio communications apparatus, such as a cellular phone, in a mobile communications system is classified roughly into a radio frequency power amplifier part that amplifies a radio frequency power and a bias control part that supplies the radio frequency power amplifier part with a direct current voltage. Further, usually, the power amplifier mounts these parts in a module substrate and is constituted as a radio frequency power amplifier module.

The bias control part controls an operating current and an operating voltage of the radio frequency power amplifier part so that the radio frequency power amplifier part can maintain a stable radio frequency characteristic against a change in the environment, such as a temperature change, and is very important. The radio frequency power amplifier part is usually controlled by changing a bias voltage at the input side of a semiconductor element that constitutes the radio frequency power amplifier part.

The bias voltage is supplied from the bias control part to the radio frequency power amplifier part via a bias supply line. At this occasion, if a radio frequency signal leaks to the bias control part through the bias supply line, the bias control part becomes unstable in an operation depending on the leakage signal. When the amount of leakage is increased, that results in an erroneous operation.

A series inductance is inserted into the bias supply line to suppress such an erroneous operation with a radio frequency signal. Consequently, the bias supply line reaches high impedance in the frequency of the radio frequency signal and the radio frequency signal arriving at the bias control part is attenuated. Conventionally, chip components or a spiral structure formed in a semiconductor element was used as this inductance.

Still more, there is an example that a bonding wire for wiring formed on a module substrate is used as an inductance. The example in which the inductance with such a bonding wire is used in a part of the wiring of a semiconductor amplifier element that is not for a bias supply line is disclosed in Japanese Patent Laid-Open No. H6(1994)-224660.

SUMMARY OF THE INVENTION

A radio frequency power module in which a series inductance is inserted into a bias supply line can be constituted as shown in FIG. 10, for example. A bias supply is performed from a bias control part 104 to a radio frequency power amplifier part 103 of 2-stage amplification via the bias supply line by inductors 908 and 909.

In a radio frequency power amplifier module used in a radio communications apparatus, such as a cellular phone, downsizing and weight reduction are advancing rapidly at present. In such circumstances, when the inductance chip components described in the Background of the Invention are used as the inductors 908 and 909, a problem is arisen that a degree of freedom of mounting other components is limited due to loading of relatively large inductance chip components on the module substrate the downsizing of which is advancing.

Further, if an attempt is made to obtain an inductance value with a fixed amount when an inductor having a spiral structure formed in a semiconductor element is used as the inductors 908 and 909, the inductor is formed in a thin pattern and the resistance component of an inductance increases. As a result, a problem is arisen that a bias voltage drop occurs, then semiconductor area increases to cause an increased chip price.

Further, when a bonding wire is utilized as the inductors 908 and 909, the bonding wire is limited in length that can be secured on a module substrate. Accordingly, a sufficient inductance value is not obtained and the attenuation of a radio frequency signal is inevitably insufficient.

The object of the present invention is to provide a radio frequency power amplifier module that brings sufficient attenuation to a radio frequency signal in a bias supply line that connects a bias control part and a radio frequency power amplifier part.

The aforementioned problem of the present invention can be dissolved effectively by using at least a bonding pad having a capacitance component to a ground and a bonding wire formed via the bonding pad in the bias supply line that connects the bias control part and the radio frequency power amplifier part.

If such a means is adopted, since a low pass filter is formed by a capacitance with the bonding pad and an inductance with the bonding wire, the filter can bring sufficient attenuation to the radio frequency signal. Further, because the bonding pad and the bonding wire can be arranged freely on a module substrate and even the occupied area is small, the module substrate area need not be increased. Still more, the bonding pad having a capacitance component to the ground can be realized by, for example, forming the bonding pad on the module substrate and a ground conductor on the surface at the opposite side of the bonding pad of the module substrate.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
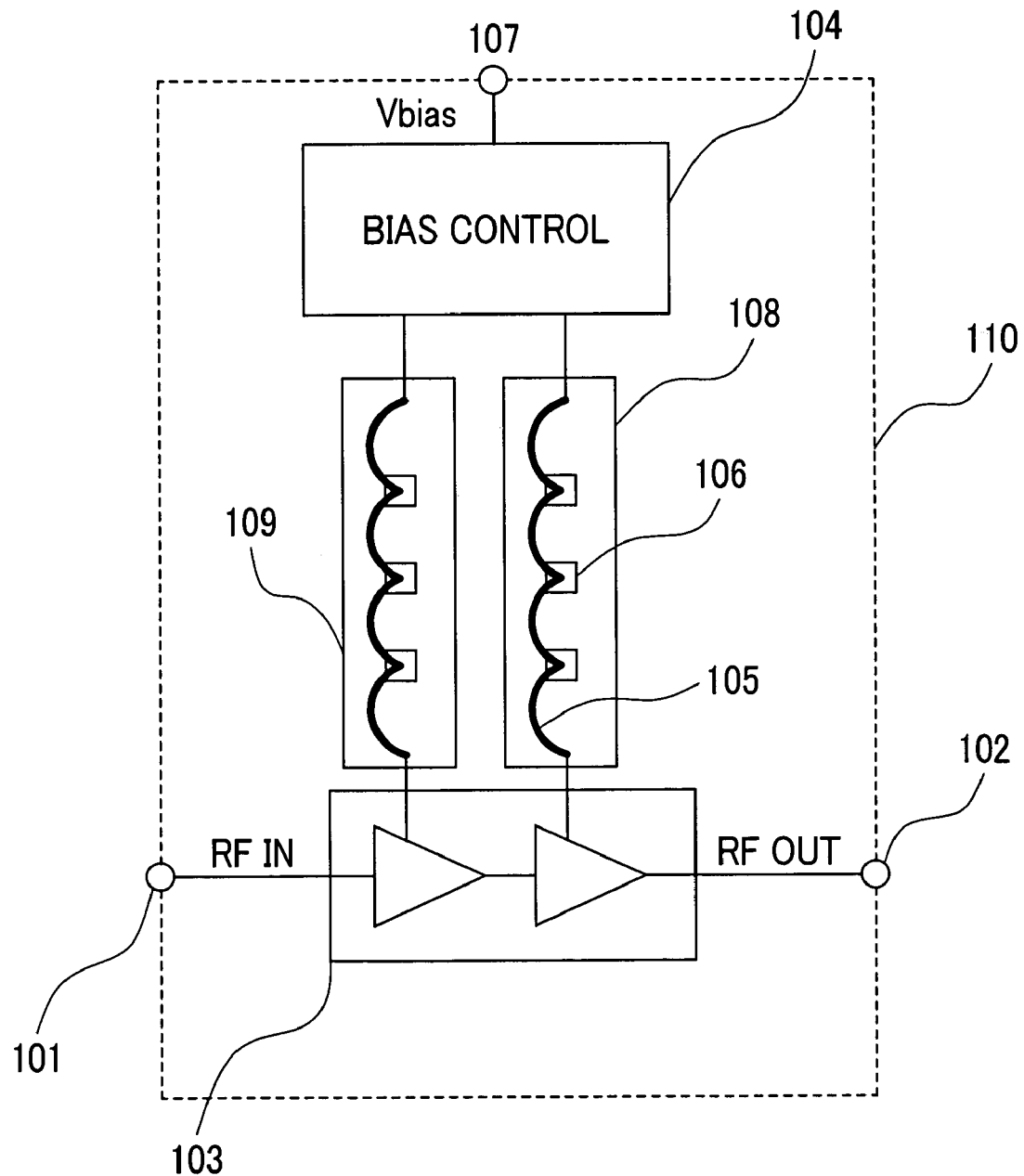
FIG. 1 is a block diagram for describing an embodiment in an invention of a radio frequency power amplifier module according to the present invention.

A radio frequency power amplifier module according to the present invention is described below with reference to the embodiments of the invention shown in the drawings. Identical symbols in FIGS. 1, 2, 5 to 7, 9 and 10 show identical or similar articles.

FIG. 1 shows an embodiment in which a radio frequency power amplifier part of 2-stage amplification is mounted in a module substrate. In FIG. 1, 110 denotes a module substrate, 103 the radio frequency power amplifier part of 2-stage amplification that performs amplification via the first stage and the final stage, 104 a bias control part that supplies the radio frequency power amplifier part 103 with a direct current bias, and 108 or 109 a bias supply line that connects the bias control part 104 and the radio frequency power amplifier part 103, respectively. A radio frequency power amplifier module is constituted by mounting the aforementioned parts in the module substrate 110. The radio frequency power amplifier part 103 and the bias control part 104 are composed of a semiconductor integrated circuit, respectively.

A radio frequency signal is input from a radio frequency signal input port (RF IN) 101, then amplified in the radio frequency power amplifier part 103 and output from a radio frequency signal output port (RF OUT) 102. A direct current voltage for the bias control part 104 is input from a direct current input port (Vbias) 107. The direct current voltage is converted to a first stage bias and a final stage bias of 2-stage amplification in the bias control part 104 and supplied to the first and final stages of the radio frequency power amplifier part 103 via the bias supply lines 109 and 108, respectively.

The bias supply lines 108 and 109 are composed of a bonding wire 105 formed via a bonding pad 106 having a capacitor component to a ground, and the bonding wire 105 assumes an inductance. Since the bonding wire 105 forms a shape exactly like a stitch by tracing a. bonding pad 106, a bias supply line is referred to as a "stitch structure inductance" anew.

Figure 2:
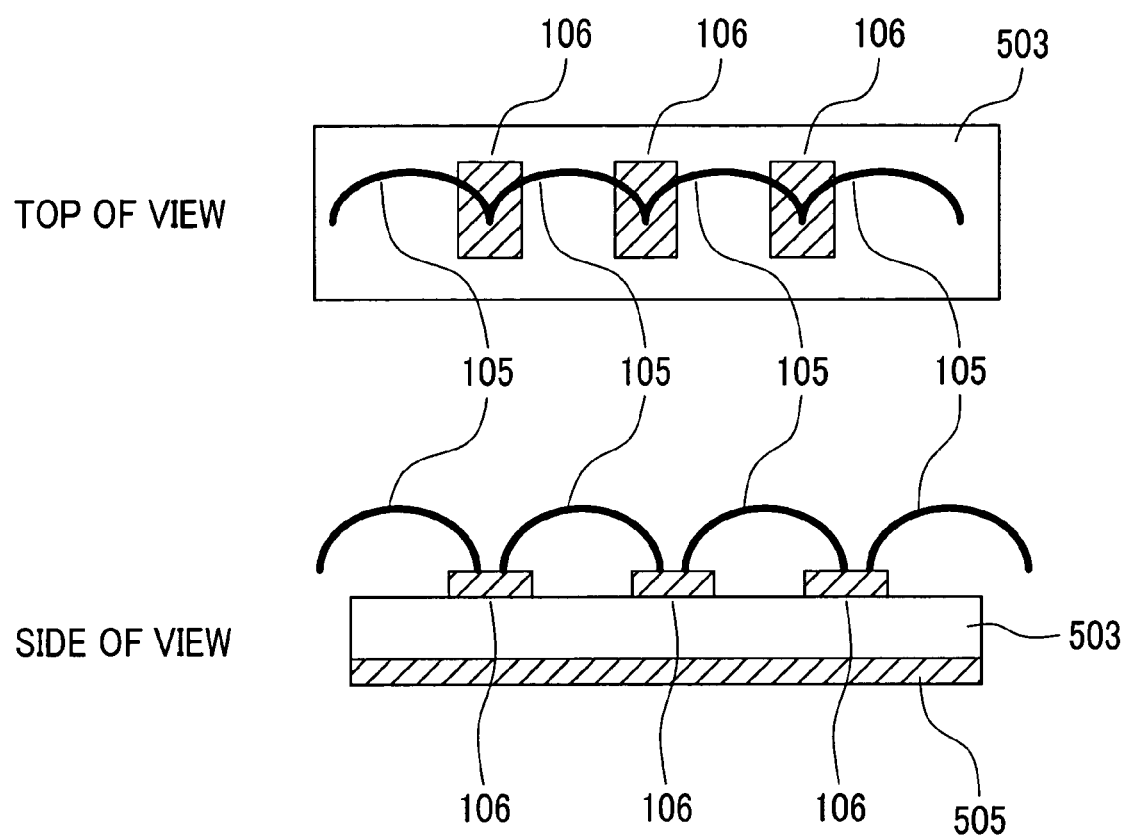
FIG. 2 is a drawing for describing a stitch structure inductance used in the radio frequency power amplifier module of the present invention.

The details of this stitch structure inductance 108 or 109 are shown in FIG. 2. The stitch structure inductance is constituted by connecting one pair or more of the bonding wire 105 and the bonding pad 106 having a capacitor component to the ground on a dielectric substrate 503. A ground conductor 505 is provided on the surface at the opposite side of the bonding pad 106 of the dielectric substrate 503.

Figure 3:
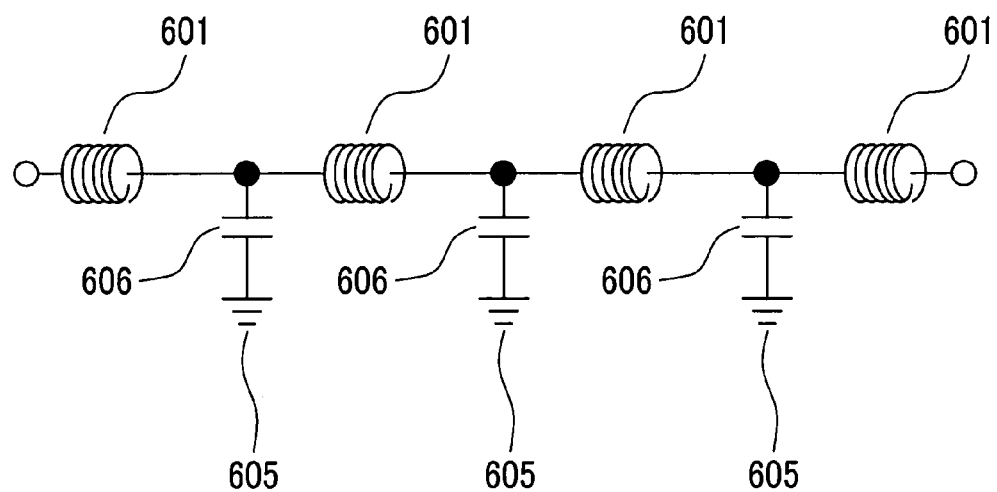
FIG. 3 is a circuit diagram for describing an equivalent circuit of the stitch structure inductance of FIG. 5.

FIG. 3 shows an equivalent circuit of this stitch structure inductance. In this case, the bonding wire 105 is represented by an inductance 601 and the capacity formed between the ground conductor 505 and the bonding pad 106 is represented by a capacitance 606. Further, the ground conductor 505 is represented by a ground 605.

The equivalent circuit of FIG. 3 constitutes a low pass filter that connects a capacitance between the connection point of the inductance connected in series and a ground. Accordingly, the filter can bring sufficient attenuation to a radio frequency signal that passes through a stitch structure inductance. This can be rephrased that the stitch structure inductance becomes a single inductor that brings the same attenuation equivalently, that is, an inductor whose inductance is high and of high impedance.

Figure 4:
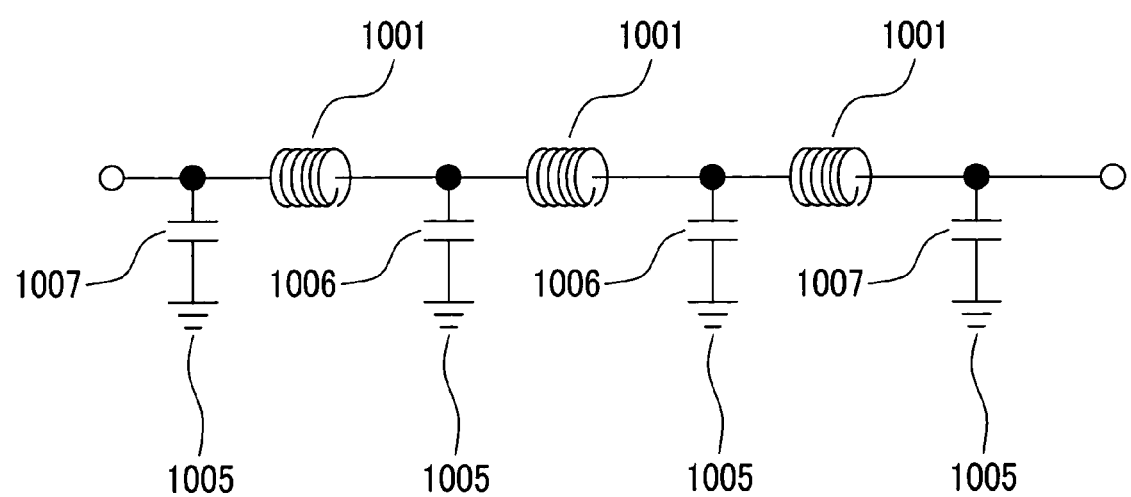
FIG. 4 is a circuit diagram for describing the stitch structure inductance of another configuration.

In the circuit described in FIGS. 2 and 3, the bonding wire 105 is composed of the connecting part between the radio frequency power amplifier part 103 of FIG. 1 and the stitch structure inductance 108 or 109 and the connecting part between the bias control part 104 and the stitch structure inductance 108 or 109, and FIG. 4 shows an equivalent circuit of the stitch structure inductance of another configuration. In this case, the equivalent circuit has a capacitance 1007 in which each of both ends is composed of a pad and a ground 1005. The intermediate structure is composed of an inductance 1001 and a capacitance 1006.

Figure 5:
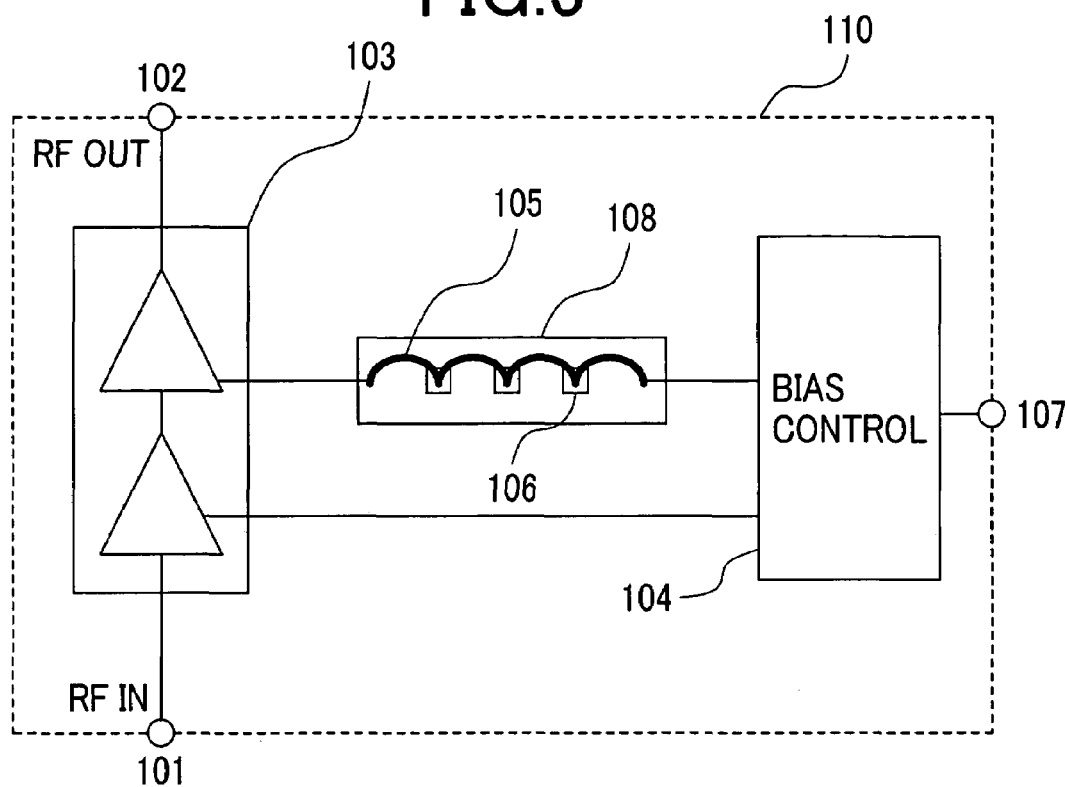
FIG. 5 is a block diagram showing another embodiment of a radio frequency power amplifier module circuit of the present invention.
Figure 6:
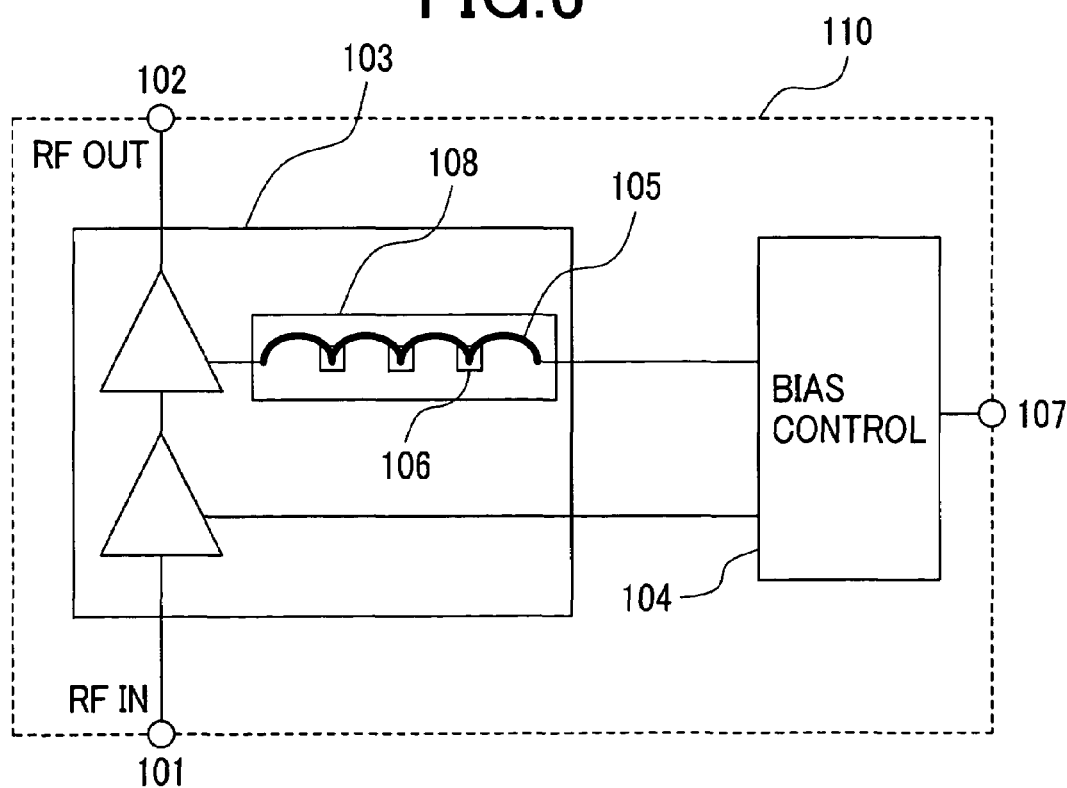
FIG. 6 is a block diagram for describing the embodiment of another invention of the radio frequency power amplifier module of the present invention.
Figure 7:
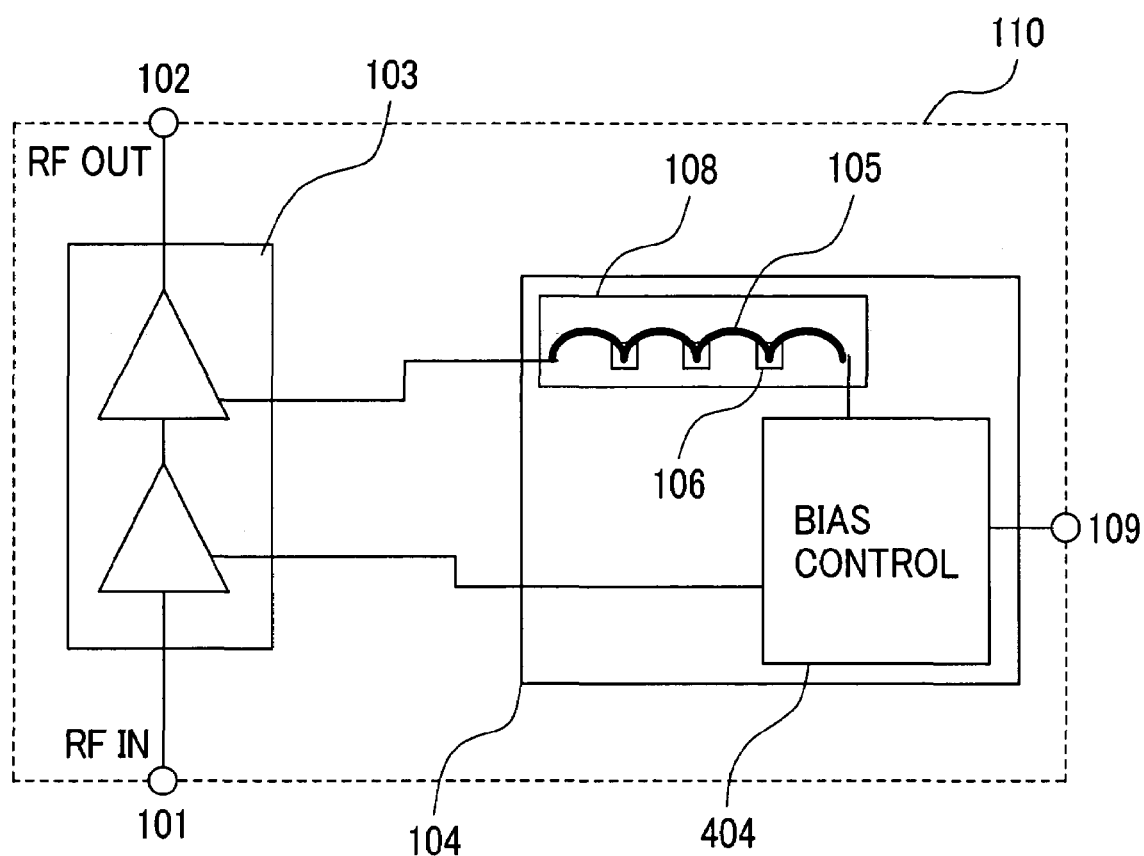
FIG. 7 is a block diagram for describing the embodiment of a further invention of the radio frequency power amplifier module of the present invention.

The stitch structure inductance shown in FIGS. 2 and 3 can be constituted as shown in FIGS. 5 to 7 in addition to the configuration shown in FIG. 1.

FIG. 5 is an example in which the stitch structure inductance 108 is used only in the final stage of the radio frequency power amplifier part 103. Because a signal level is low in the first stage, the radio frequency signal leaking from the first stage does not cause a problem in some cases, and the configuration of FIG. 5 is applied to such a case.

FIG. 6 is an example in which the stitch structure inductance 108 is formed on the semiconductor substrate of the radio frequency power amplifier part 103 formed as a semiconductor integrated circuit. In this case, the capacitance of the stitch structure inductance 108 is formed sandwiching an insulation layer formed on a semiconductor substrate. Still more, the pad 106 of the stitch structure inductance 108 can be divided and even provided on the semiconductor substrate and the module substrate 110 independently of the aforementioned example.

FIG. 7 is an example in which the stitch structure inductance 108 is formed on the semiconductor substrate of the bias control part 104 formed as a semiconductor integrated circuit. A bias control circuit main body 404 is mounted in the semiconductor substrate.

Further, although not shown, a stitch structure inductance is formed on a semiconductor substrate when a radio frequency power amplifier part and a bias control part are constituted as a semiconductor integrated circuit on the same semiconductor substrate.

Figure 8:
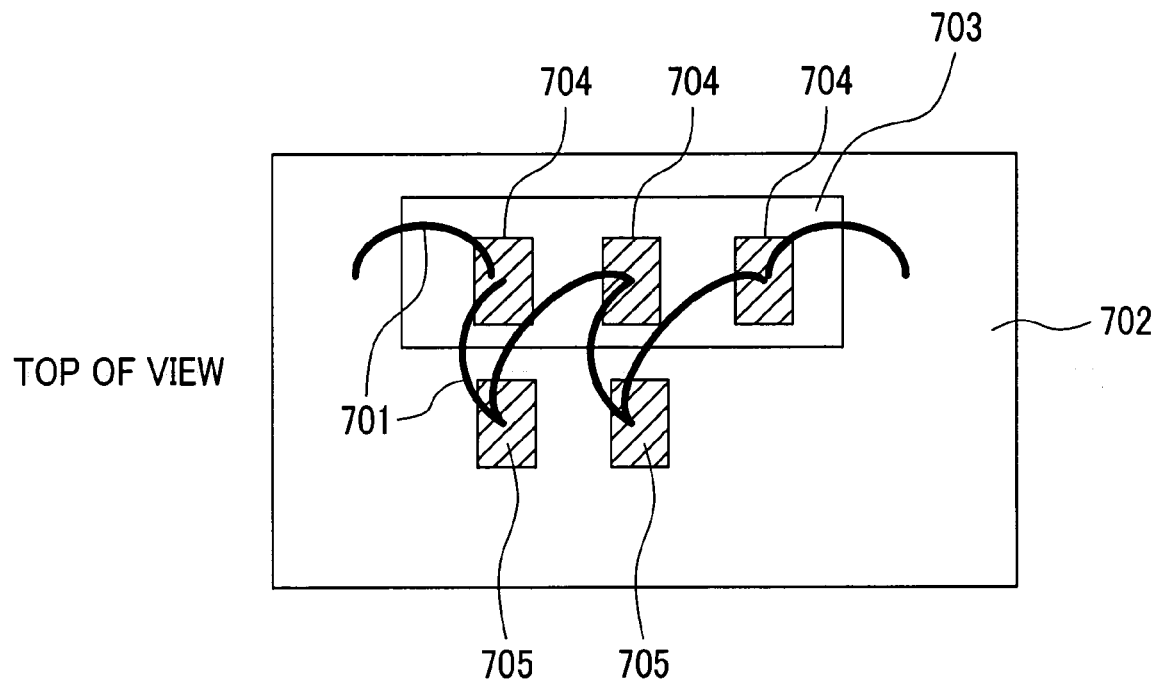
FIG. 8 is a drawing for describing the stitch structure inductance of another configuration used in the radio frequency power amplifier module of the present invention.
Figure 8:
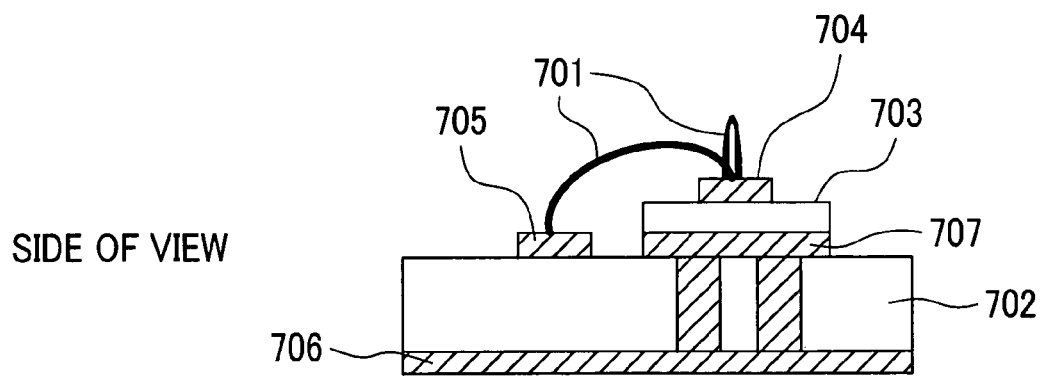

Still more, to realize a stitch structure, all stitch structures can be constituted of mutual connection from a first dielectric substrate (second substrate) 703 having the stitch structure to a second dielectric substrate 702, as shown in FIG. 8 instead of being constituted in the same substrate. A bonding pad 704 and a ground conductor 707 are formed on the first dielectric substrate 703 and a bonding pad 705 and a ground conductor 706 are formed on the second dielectric pad 702. A bonding wire 701 is connected between the respective bonding pads.

Figure 9:
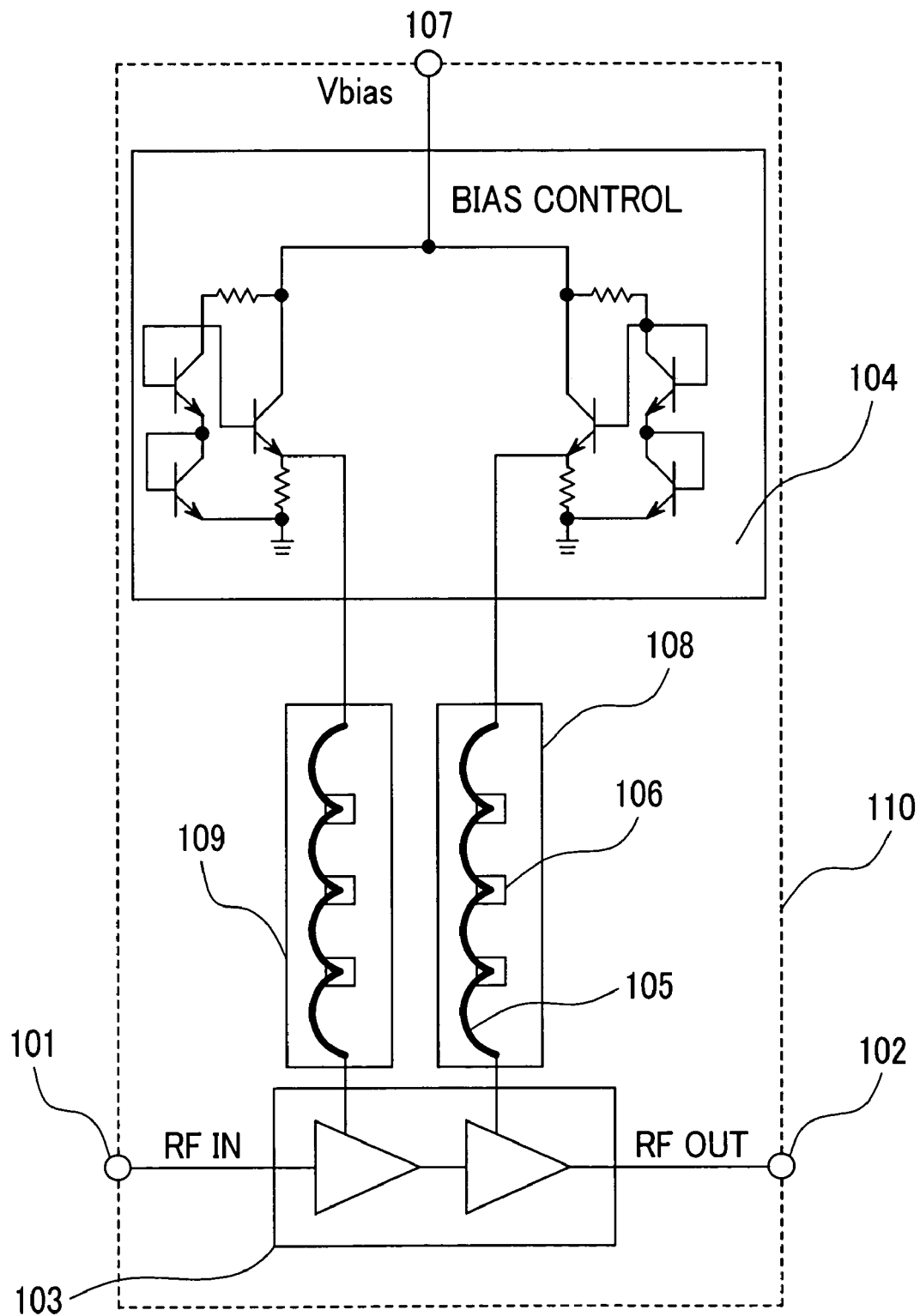
FIG. 9 is a block diagram for describing an example of a bias control part used in the radio frequency power amplifier module of the present invention.
Figure 10:
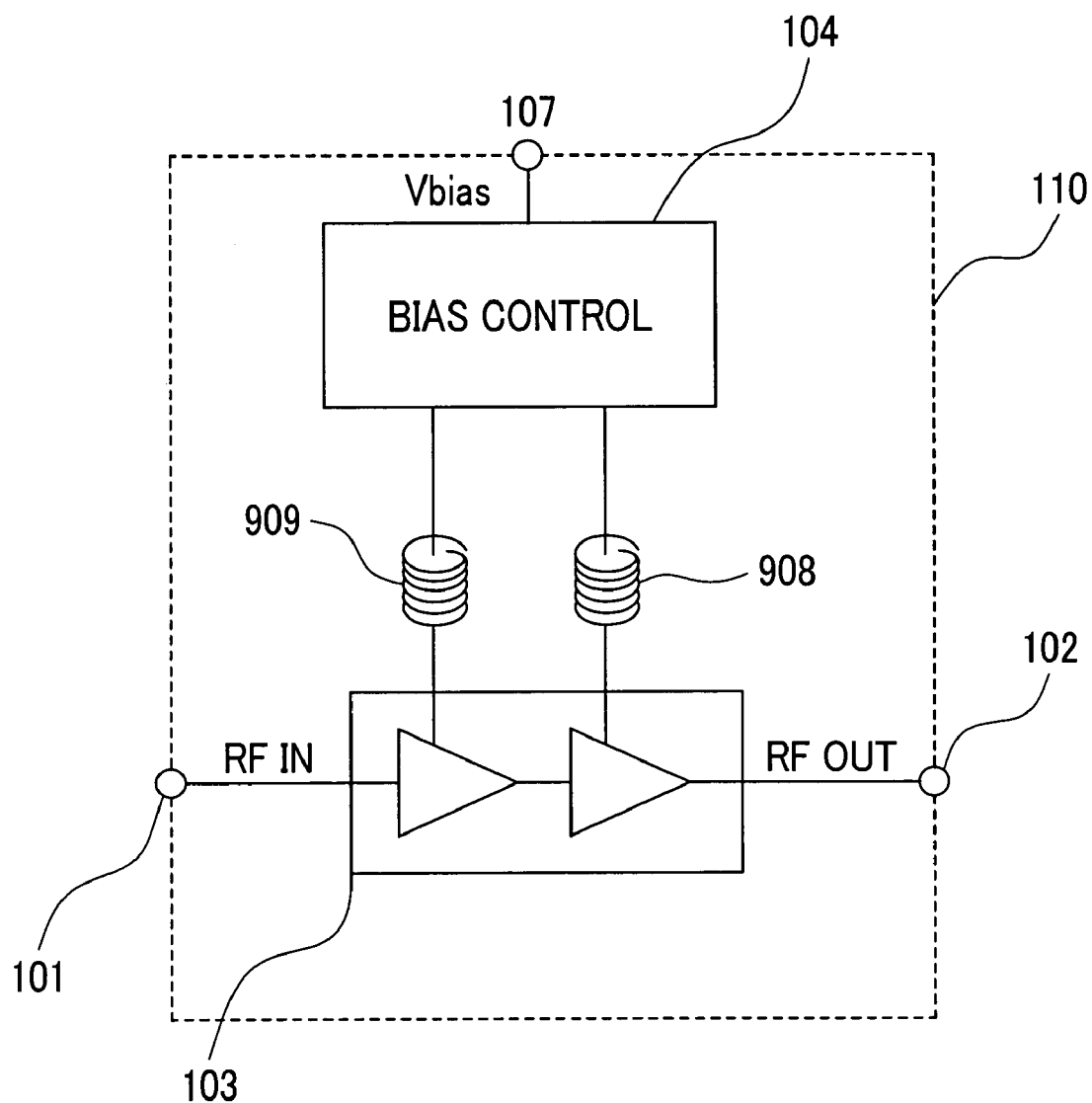
FIG. 10 is a block diagram for describing the example of the radio frequency power amplifier module that constitutes a bias supply line by a single inductor module.

Further, the bias control part 104 is composed of a circuit that converts the direct current voltage input from the direct current input port 107 into a bias voltage using a transistor element, as shown in FIG. 9 specifically. The present invention is not limited to such a circuit, but is effective even for any circuit format, such as a bias control circuit which outputs a direct current.

According to the present invention, since a low pass filter is formed equivalently in the bias supply line connecting a bias control part and a radio frequency power amplifier part, the leakage of a radio frequency signal into the bias control part is suppressed, and, accordingly, the stable operation of the bias control part is obtained. As a result, the radio frequency characteristic of the radio frequency power amplifier part can be retained satisfactorily. Further, when inductance chip components or a spiral inductor is used or composed of a single bonding wire module by employing a combined bonding wire formed via a bonding pad having a capacitance, an increase in installation area is prevented. Consequently, a compact, lightweight, and low-cost radio frequency power module can be realized.

It is further understood by those skilled in the art that the foregoing description is a preferred embodiment of the disclosed device and that various changes and modifications may be made in the invention without departing from the spirit and scope thereof.

What is claimed is:

1. A radio frequency amplifier module, comprising:
    a module substrate;
    a radio frequency power amplifier part which is arranged on said module substrate and amplifies a power of a radio frequency signal;
    a bias control part which is arranged on said module substrate and controls operation of said radio frequency power amplifier part with a bias voltage; and
    a bias supply line for supplying the bias voltage from said bias control part to said radio frequency power amplifier part, said bias supply line being connected between said radio frequency power amplifier part and said bias control part,
    wherein said bias supply line comprises a low pass filter which brings attenuation to a radio frequency signal leaking from said radio frequency power amplifier part to said bias control part.

2. The radio frequency amplifier module according to claim 1,
    wherein said radio frequency power amplifier part is constituted as a semiconductor integrated circuit formed on a semiconductor substrate and said bias supply line is formed on said semiconductor substrate.

3. The radio frequency amplifier module according to claim 1,
    wherein said bias control part is constituted as a semiconductor integrated circuit formed on a semiconductor substrate and said bias supply line is formed on said semiconductor substrate.

4. The radio frequency amplifier module according to claim 1,
    wherein said radio frequency power amplifier part and said bias control part are constituted as a semiconductor integrated circuit formed on the same semiconductor substrate and said bias supply line is formed on said semiconductor substrate.

5. The radio frequency amplifier module according to claim 1,
    wherein said bias supply line is formed on said module substrate.

6. The radio frequency amplifier module according to claim 1,
    wherein said bias supply line includes at least one bonding pad having a capacitance component to a ground and a bonding wire formed via said at least one bonding pad.

7. The radio frequency amplifier module according to claim 6, further comprising:
    a second substrate formed on said module substrate,
    wherein one part of a plurality of bonding pads included in said at least one bonding pad is formed on said module substrate and the other part of said plurality of bonding pads is formed on said second substrate.

8. The radio frequency amplifier module according to claim 6,
    wherein said radio frequency power amplifier part is constituted as a semiconductor integrated circuit formed on a semiconductor substrate and said bias supply line is formed on said semiconductor substrate.

9. The radio frequency amplifier module according to claim 6,
    wherein said bias control part is constituted as a semiconductor integrated circuit formed on a semiconductor substrate and said bias supply line is formed on said semiconductor substrate.

10. The radio frequency amplifier module according to claim 6,
    wherein said radio frequency power amplifier part and said bias control part are constituted as a semiconductor integrated circuit formed on the same semiconductor substrate and said bias supply line is formed on said semiconductor substrate.

11. The radio frequency amplifier module according to claim 6, wherein said bias supply line is formed on said module substrate.

* * * * *